(12) United States Patent
Yamamoto

(10) Patent No.: US 9,020,311 B2
(45) Date of Patent: Apr. 28, 2015

(54) OPTICAL WAVEGUIDE AND OPTICAL MODULE

(71) Applicant: Shinko Electric Industries Co., Ltd., Nagano-shi, Nagano (JP)

(72) Inventor: Kazunao Yamamoto, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 32 days.

(21) Appl. No.: 14/063,540

(22) Filed: Oct. 25, 2013

(65) Prior Publication Data

US 2014/0119702 A1 May 1, 2014

(30) Foreign Application Priority Data

Oct. 29, 2012 (JP) ................................. 2012-238097

(51) Int. Cl.
*G02B 6/42* (2006.01)
*H05K 1/02* (2006.01)
*G02B 6/43* (2006.01)

(52) U.S. Cl.
CPC ............... *G02B 6/4214* (2013.01); *G02B 6/43* (2013.01); *H05K 1/0274* (2013.01); *H05K 2201/10121* (2013.01)

(58) Field of Classification Search
None
See application file for complete search history.

(56) References Cited

U.S. PATENT DOCUMENTS

2012/0155822 A1* 6/2012 Yanagisawa et al. ......... 385/130
2012/0318964 A1* 12/2012 Yamamoto et al. ...... 250/227.11

FOREIGN PATENT DOCUMENTS

JP 2007-293244 11/2007

* cited by examiner

*Primary Examiner* — Jerry Rahll
(74) *Attorney, Agent, or Firm* — Rankin, Hill & Clark LLP

(57) ABSTRACT

An optical waveguide includes a first cladding layer, at least two core portions formed on the first cladding layer and extended in a first direction, at least two groove portions formed in each of the core portions at positions spaced apart from each other in the first direction, each groove portion having an inclined surface, an optical path conversion mirror formed on one of the inclined surfaces formed in each of the core portions, and a second cladding layer formed on the first cladding layer and the core portions. The optical path conversion mirrors formed in the core portions adjacent to each other are arranged at positions different from each other in the first direction. The groove portions formed in the core portions adjacent to each other are arranged at the same positions in the first direction.

5 Claims, 13 Drawing Sheets

US 9,020,311 B2

OPTICAL WAVEGUIDE AND OPTICAL MODULE

CROSS-REFERENCE TO RELATED APPLICATION(S)

The present application claims the benefit of priority of Japanese Patent Application No. 2012-238097, filed on Oct. 29, 2012. The disclosures of the application are incorporated herein by reference.

BACKGROUND

1. Technical Field

The present disclosure relates to an optical waveguide, an optical module and a method of manufacturing the optical waveguide.

2. Related Art

In recent years, while maintenance of communication lines of a mission-critical system through an optical fiber communication technology is progressing steadily, there is an issue of electrical wiring within an information terminal still being a bottleneck. Therefore, in place of using an electric circuit board, which is carried out in every signal transmission using an electric signal, a photoelectric composite board (optical module) of a type, in which a high-speed portion is transmitted by an optical signal, is proposed in order to compensate for the limitations of the electric signal transmission speed.

In the photoelectric composite board, the optical signal is transmitted by an optical waveguide having a structure in which a core layer is surrounded by a cladding layer. For example, Patent Document 1 discloses an optical waveguide having a multilayer structure in which a plurality of core layers are provided.

In such an optical waveguide, first, a first cladding layer and a first core layer are sequentially formed on a board, and a plurality of core portions of a first layer are formed by exposing and developing the first core layer. Next, a second cladding layer for covering the core portions of the first layer and the first cladding layer is formed. Subsequently, a second core layer is formed on the second cladding layer, and a plurality of core portions of a second layer are formed by exposing and developing the second core layer. Subsequently, a third cladding layer is formed on the core portions of the second layer and the second cladding layer. Thereafter, the same processes as above are repeated, thereby forming the optical waveguide having the multilayer structure.

PATENT DOCUMENT

[Patent Document 1] JP-A-2007-293244

However, in the optical waveguide having the multilayer structure, it is necessary to form a cladding layer between core layers. This is because core portions of the core layer are projected if the core layer is formed on the cladding layer, and thus it is necessary to cover the core portions and to planarize the core layer by using the cladding layer before the next core layer is formed. As such, there are problems that the size of the optical waveguide in the thickness direction (direction of providing the layers) is increased and wiring density of an optical wiring is decreased.

SUMMARY

An optical waveguide according to an exemplary embodiment of the invention comprises:

a first cladding layer;
at least two core portions formed on the first cladding layer and extended in a first direction;
at least two groove portions formed in each of the core portions at positions spaced apart from each other in the first direction, each groove portion having an inclined surface;
an optical path conversion mirror formed on one of the inclined surfaces formed in each of the core portions; and
a second cladding layer formed on the first cladding layer and the core portions,
wherein the optical path conversion mirrors formed in the core portions adjacent to each other are arranged at positions different from each other in the first direction, and
wherein the groove portions fainted in the core portions adjacent to each other are arranged at the same positions in the first direction.

According to an exemplary embodiment of the present invention, there is an advantage that high density of an optical wiring is achieved.

DETAILED DESCRIPTION

Hereinafter, an exemplary embodiment will be described with reference to the accompanying drawings.

The accompanying drawings may have a view which enlarges a feature for convenience in order to facilitate the understanding of the feature, and the dimensional ratio of each configuration component may not be the same as the actual dimension. In the cross-sectional view, in order to easily understand a cross-sectional structure of each member, the hatching of some members is omitted.

Figure 2:
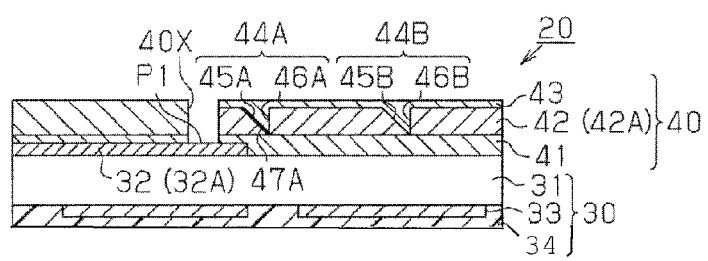
FIG. 2 is a schematic cross-sectional view showing the part of the optical waveguide mounted wiring board according to the exemplary embodiment taken along line 2-2 in FIG. 1.

As illustrated in FIG. 2, an optical waveguide mounted wiring board (package) 20 includes a wiring board 30, and an optical waveguide 40 provided on the wiring board 30. The optical waveguide 40 is integrated with the wiring board 30.

First, a structure of the wiring board 30 will be described.

The wiring board 30 includes a board main body 31, a wiring pattern 32 being an uppermost layer, a wiring pattern 33 being a lowermost layer, and a solder resist layer 34.

The wiring pattern 32 and 33 are formed on upper and lower surfaces of the board main body 31. The wiring patterns 32 and 33 form a structure that is electrically connected to each other through an inside of the board main body 31. A wiring layer may or may not be formed in an inside of the board main body 31. In a case where the wiring layer is formed in the inside of the board main body 31, a plurality of wiring layers are provided through insulation layers and are electrically connected to each other through vias formed in each of the insulation layers, and the wiring patterns 32 and 33 are electrically connected to each other by the vias and the wiring layers. As the board main body 31, it is possible to use a build-up board with a core board, a coreless board without the core board, or the like, for example.

The wiring pattern 32 is formed on a mounting surface side (upper surface side in FIG. 2) in which optical elements 51 and 52 (refer to FIG. 4) are mounted. A thickness of the wiring pattern 32 may be about 15 to 35 µm, for example. Copper (Cu) or a copper alloy can be used as material of the wiring pattern 32, for example.

Figure 1:
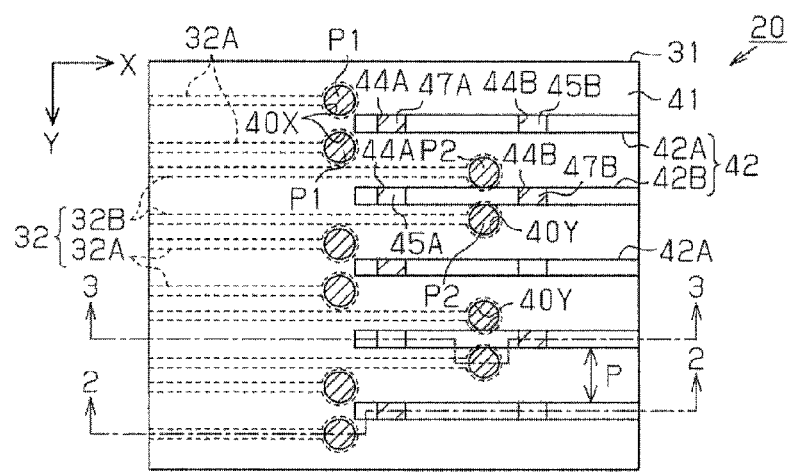
FIG. 1 is a schematic plane view showing a part of an optical waveguide mounted wiring board according to an exemplary embodiment.
Figure 4:
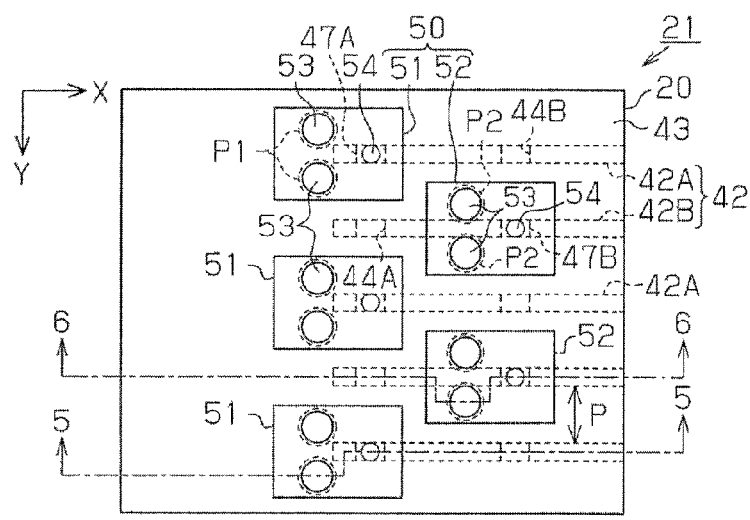
FIG. 4 is a schematic plane view showing a part of an optical module according to an exemplary embodiment.

As illustrated in FIG. 1, the wiring pattern 32 includes wiring patterns 32A with connection pads P1 which are electrically connected to the optical element 51 (refer to FIG. 4), and wiring patterns 32B with connection pads P2 which are electrically connected to the optical element 52 (refer to FIG. 4). Each of the wiring patterns 32A and 32B is formed substantially in a band shape in plan view, and extended linearly in an X direction (horizontal direction in FIG. 1). An end portion of each of the wiring patterns 32A and 32B is formed substantially in a circular shape in plan view. The wiring pattern 32B is extended to be longer than the wiring pattern 32A in the X direction (first direction). In the wiring patterns 32, a pair of the wiring patterns 32A and a pair of the wiring patterns 32B are arranged alternately along Y direction (vertical direction in FIG. 1) which is orthogonal to the X direction in plan view. In FIG. 1, a second cladding layer 43 which will be described later is omitted for convenience.

Figure 3:
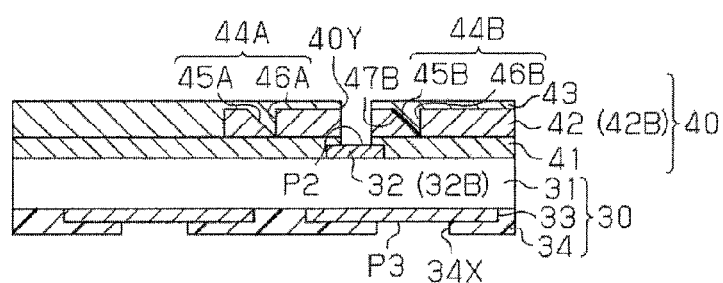
FIG. 3 is a schematic cross-sectional view showing the part of the optical waveguide mounted wiring board according to the exemplary embodiment taken along line 3-3 in FIG. 1.

As illustrated in FIG. 3, the wiring pattern 33 is formed on the opposite surface side (a lower surface side in FIG. 3) to the mounting surface. The wiring pattern 33 includes an external connection pad P3. A thickness of the wiring pattern 33 may be about 15 to 35 µm, for example. As the material of the wiring pattern 33, the copper or the copper alloy can be used, for example.

The solder resist layer 34 is formed on the lower surface of the board main body 31 so as to cover the wiring pattern 33. In the solder resist layer 34, an opening portion 34X is formed so as to expose a part of the wiring pattern 33 as the external connection pad P3. An external connection terminal such as a solder ball or a lead pin is connected to the external connection pad P3, which is used when the package 20 is mounted on a mounting board such as a mother board. As necessary, an Organic Solderability Preservative (OSP) film may be formed on the wiring pattern 33 which is exposed from the opening portion 34X by performing an OSP process, and the external connection terminal may be connected to the OSP film. A metal layer may be formed on the wiring pattern 33 which is exposed from the opening portion 34X, and the external connection terminal may be connected to the metal layer. As an example of the metal layer, there is a gold (Au) layer, a nickel (Ni)/Au layer (for example, the metal layer which is formed by sequentially providing a Ni layer and the Au layer on the wiring pattern 33), a Ni/palladium (Pd)/Au layer (the metal layer which is formed by sequentially providing the Ni layer, a Pd layer and the Au layer on the wiring pattern 33) or the like, for example. The wiring pattern 33 (or the OSP film or the metal layer in a case where the OSP film or the metal layer is formed on the wiring pattern 33) itself which is exposed from the opening portion 34X may be the external connection terminal.

For example, planar shapes of the opening portion 34X and the external connection pad P3 are circular shapes, and diameter thereof may be about 200 to 300 µm. The height of a lower surface of the wiring pattern 33 to a lower surface of the solder resist layer 34 may be about 20 to 40 µm, for example. For example, as the material of the solder resist layer 34, an epoxy-based or acrylic-based insulating resin can be used.

Next, a structure of the optical waveguide 40 will be described.

The optical waveguide 40 is formed on the upper surface of the board main body 31 of the wiring board 30. The optical waveguide 40 includes a first cladding layer 41, a core portion 42 and the second cladding layer 43.

The first cladding layer 41 is formed on the upper surface of the board main body 31. The core portion 42 is an optical wiring for performing optical signal propagation, and formed on the first cladding layer 41. The second cladding layer 43 is formed on the first cladding layer 41 so as to cover the core portion 42. The optical waveguide 40 has a structure in which the first cladding layer 41, the core portion 42, and the second cladding layer 43 are sequentially provided on the upper surface of the board main body 31, and a structure having the core portion 42 surrounded by the first cladding layer 41 and the second cladding layer 43. In other words, the wiring board 30 is arranged on an outer surface side of the first cladding layer 41.

Basically, the same materials can be used as the materials of the first and second cladding layers 41 and 43 and the core portion 42. For example, as the materials of the first and second cladding layers 41 and 43 and the core portion 42, it is possible to use a resin material with optical transparency in a wavelength region which is used by the optical elements 51 and 52 (refer to FIG. 4). Specifically, as the materials of the first and second cladding layers 41 and 43 and the core portion 42, it is possible to use an acrylic-based resin such as a Polymethylmethacrylate (PMMA), an epoxy-based resin, a silicone-based resin or the like. In order for the optical signal propagation to be performed only within the core portion 42, as the materials constituting the core portion 42, the materials with higher refractive index than that of the materials constituting the first and second cladding layers 41 and 43 which are formed on both an upper surface and a lower surface of the core portion 42 are selected. A difference in refractive indexes between the core portion 42, the first cladding layer 41 and the second cladding layer 43 is not particularly limited and it is preferably about 0.3 to 5%, and more preferably about 0.8 to 3%.

As illustrated in FIG. 1, on an upper surface of the first cladding layer 41, N (here, 5 pieces) core portions 42 are arranged side by side along Y direction. Each of the core portions 42 is formed substantially in the band shape in plan view, and is extended linearly in the X direction (first direction). The N core portions 42 have lengths of the X direction which are set in substantially equal length. The core portion 42 includes a core portion 42A formed according to the optical element 51 (refer to FIG. 4) which is mounted on the package 20, and a core portion 42B formed according to the optical element 52 (refer to FIG. 4) which are mounted on the package 20. In the core portions 42 of the embodiment, the core portion 42A and the core portion 42B are paired. In the core portions 42, the core portion 42A and the core portion 42B are formed alternately along the Y direction.

The thickness of the first cladding layer 41 illustrated in FIGS. 2 and 3, more specifically, the height of an upper surface of the wiring pattern 32 to the upper surface of the first cladding layer 41 may be about 10 to 15 µm, for example. The thickness of the core portion 42 may be about 30 to 80 µm, for example, and a width of the core portion 42 may be about 30 to 80 µm, for example. The pitch of the core portion 42 may be about 62.5 to 250 µm, for example. The height from an upper surface of the core portion 42 to an upper surface of the second cladding layer 43 may be about 30 to 80 µm, for example.

In each of the core portions 42, M (here, 2 pieces) groove portions 44A and 44B are formed. The number of the groove portions in each of the core portions 42 is the same as that of the core portions constituting one pair in the core portions 42. As illustrated in FIG. 1, a groove portion 44A and a groove portion 44B are formed in a position separated from each other in the X direction. The groove portions 44A are arranged linearly along the Y direction in the core portions 42, respectively. In the same manner, the groove portions 44B are arranged linearly along the Y direction in the core portions 42, respectively. In other words, the groove portions 44A and 44B formed in the core portions 42A and 42B adjacent to each other are arranged at the same positions in the X direction.

As illustrated in FIGS. 2 and 3, each of the groove portions 44A and 44B is formed so as to penetrate a thickness direction of the core portion 42, and formed so as to divide the core portion 42. Each of groove portions 44A has an inclined surface 45A and a sidewall surface 46A intersected with the inclined surface 45A. Each of groove portions 44B has an inclined surface 45B and a sidewall surface 46B intersected with the inclined surface 45B. For example, in each of the groove portions 44A and 44B, the sidewall surfaces 46A and 46B are formed on vertical surfaces which are intersected with an extending direction (X direction) of the optical waveguide 40 (the core portion 42), and the inclined surfaces 45A and 45B are formed to be inclined in a predetermined angle (for example, 45 degree) with respect to the extending direction of the optical waveguide 40 (the core portion 42). For this reason, a cross-sectional shape of each of the groove portions 44A and 44B is formed substantially in a right triangle shape. The sidewall surfaces 46A and 46B of the groove portions 44A and 44B are not needed to be the vertical surfaces, and may be the inclined surface inclined to some extent inside the optical waveguide 40 (right side of FIGS. 2 and 3), for example. That is, the groove portions 44A and 44B may be formed substantially in a V shape in cross-sectional view. Each of the groove portions 44A and 44B may be formed to the middle of the thickness direction of the first cladding layer 41 by penetrating the core portion 42 from the upper surface of the core portion 42.

Here, the length of an opening end in an upper side of the core portion 42 in each of the groove portions 44A and 44B may be configured to be equal to or slightly longer than the thickness (a distance from the upper surface to the lower surface of the core portion 42) of the core portion 42.

As illustrated in FIG. 2, on the inclined surface 45A which is formed in the core portion 42A, an optical path conversion mirror 47A is formed to convert an optical path by 90°. The optical path conversion mirror 47A is formed to be inclined at a predetermined angle (for example, 45°) with respect to a progressing direction of light which propagates the core portion 42A. As illustrated in FIG. 3, on the inclined surface 45B formed in the core portion 42B, an optical path conversion mirror 47B for converting the optical path by 90° is formed. The optical path conversion mirror 47B is formed to be inclined at a predetermined angle (for example 45°) with respect to a progressing direction of light which propagates the core portion 42B. Here, on the inclined surface 45B which is formed in the core portion 42A, and the inclined surface 45A which is formed in the core portion 42B, the optical path conversion mirrors 47A and 47B are not formed.

In this way, the optical path conversion mirrors 47A and 47B are selectively formed on any one of the M (here, 2 pieces) inclined surfaces 45A and 45B which are formed in each core portion 42. Specifically, the optical path conversion mirror 47A is selectively formed only on the inclined surface 45A out of the inclined surfaces 45A and 45B which are fixated in the core portion 42A and the optical path conversion mirror 47B is selectively formed only on the inclined surface 45B out of the inclined surfaces 45A and 45B which are formed in the core portion 42B. For this reason, as illustrated in FIG. 1, the optical path Conversion mirrors 47A and 47B which are formed in the adjacent core portions 42 (that is, the core portion 42A and the core portion 42B) are arranged in positions in which X direction positions (planar positions) are different from each other. Specifically, the optical path conversion mirrors 47A and 47B are arranged in a zigzag shape (saw-tooth shape) in plan view. The optical path conversion mirror 47A is formed according to the wiring pattern 32A, and the optical path conversion mirror 47B is formed according to the wiring pattern 32B. As the materials of the optical path conversion mirrors 47A and 47B, gold (Au), silver (Ag) or Aluminum (Al) which has a good light reflectivity can be used, for example.

As illustrated in FIGS. 2 and 3, the second cladding layer 43 is formed on the first cladding layer 41, so as to fill the groove portions 44A and 44B, and cover the core portions 42A and 42B.

As illustrated in FIG. 2, in the optical waveguide 40, an opening portion 40X for exposing a part of the wiring pattern 32A as the connection pad P1 is formed. That is, the opening portion 40X is formed by penetrating the second cladding layer 43, the core portion 42, and the first cladding layer 41 in a thickness direction. As illustrated in FIG. 3, in the optical waveguide 40, an opening portion 40Y for exposing a part of the wiring pattern 32B as the connection pad P2 is formed. That is, the opening portion 40Y is formed by penetrating the second cladding layer 43, the core portion 42, and the first cladding layer 41 in the thickness direction. In addition, as necessary, the OSP film may be formed by performing the OSP process on the wiring patterns 32 which are exposed from the opening portions 40X and 40Y. In addition, the metal layer may be formed on the wiring patterns 32 which are exposed from the opening portions 40X and 40Y. As an example of the metal layer, there may be the Au layer, the Ni/Au layer, the Ni/Pd/Au layer or the like, for example.

As illustrated in FIG. 1, when the opening portions 40X and 40Y and the connection pads P1 and P2 are on the plane, they are in the circular shape, for example, and diameters may be about 50 to 200 μm, for example. The opening portions 40X and the connection pads P1 are arranged linearly along the Y direction. The opening portions 40Y and the connection pads P2 are arranged linearly along the Y direction in plan view.

Next, a structure of an optical module 21 will be described.

As illustrated in FIG. 4, the optical module 21 has the package 20 and N (here, 5 pieces) optical elements 50 which are the same number as the total number of the core portions 42. As the optical element 50, a light emitting element such as a Vertical Cavity Surface Emitting Laser (VCSEL) or a Light Emitting Diode (LED) can be used, for example. In addition, as the optical element 50, a light receiving element such as a Photo Diode (PD) or an Avalanche Photo Diode (APD) can be used, for example. The optical elements 50 have the three optical elements 51 and there are the same number of the core portions 42A, and the two optical elements 52 which are the same number as the core portions 42B. The three optical elements 51 are arranged linearly along the Y direction, and the two optical elements 52 are arranged linearly along the Y direction. Furthermore, the optical element 51 and the optical element 52 are arranged in positions in which X direction positions (planar positions) are different from each other while the optical element 51 and the optical element 52 are arranged in positions in which parts thereof are overlapped in the Y direction. That is, five optical elements 50 (three optical elements 51 and two optical elements 52) are arranged in a substantially zigzag shape in plan view. The optical element 51 and the optical element 52 may be the same optical element, or the different optical element. In the embodiment, the optical element 51 is the light emitting element such as the light emitting diode, and the optical element 52 is the light receiving element such as the photo diode. The sizes of the optical elements 51 and 52 may be about 200 μm×200 μm to 500 μm×500 μm in plan view.

Figure 5:
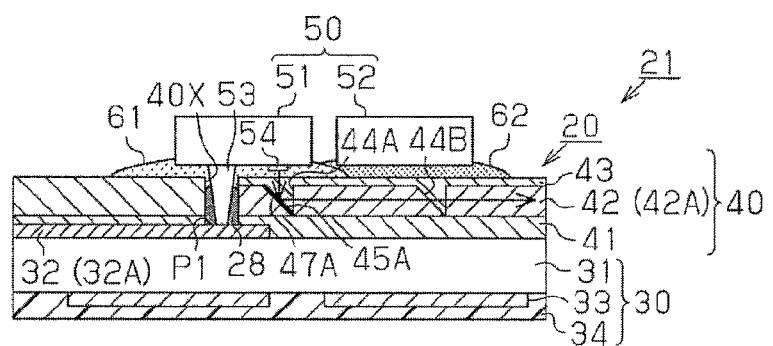
FIG. 5 is a schematic cross-sectional view showing the part of the optical module according to the exemplary embodiment taken along line 5-5 in FIG. 4.
Figure 6:
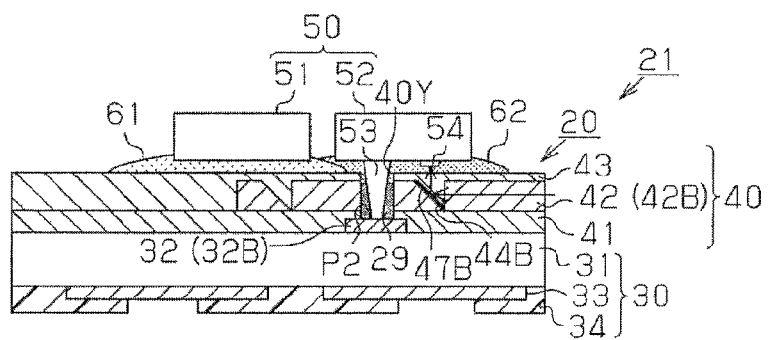
FIG. 6 is a schematic cross-sectional view showing the part of the optical module according to the exemplary embodiment taken along line 6-6 in FIG. 4.

Each of optical elements 50 has two electrode terminals 53 and one light receiving/emitting unit 54 (light emitting unit or light receiving unit). As illustrated in FIGS. 5 and 6, the electrode terminal 53 and the light receiving/emitting unit 54 are formed on one surface (here, lower surface) of the optical element 50. One of the two electrode terminals 53 is connected to a cathode electrode (not shown) in the optical element 50, and the other electrode terminal 53 is connected to an anode electrode (not shown) in the optical elements 50. In FIG. 4, in order to make the structure of the optical elements 50 comprehensible, the electrode terminal 53 and the light receiving/emitting unit 54 are illustrated by a solid line.

As illustrated in FIG. 5, each of optical elements 51 is mounted on the wiring board 30 on which the optical waveguide 40 is provided (integrated). More specifically, on the connection pad P1 of the wiring board 30, the solder 28 is formed. Then, the optical element 51 is electrically connected to the connection pad P1 of the wiring board 30 through the electrode terminal 53 and the solder 28. As a result, each optical element 51 is electrically connected to the wiring pattern 32A. Each of optical elements 51 is arranged so that the light receiving/emitting unit 54 thereof is facing the optical path conversion mirror 47A. Specifically, each of optical elements 51 is mounted on the wiring board 30 so that the light receiving/emitting unit 54 thereof is arranged just above the optical path conversion mirror 47A.

An underfill resin 61 is formed between each optical element 51 and the optical waveguide 40 provided on the wiring board 30. The underfill resin 61 is formed so as to fill the opening portion 40X. The underfill resin 61 is a resin for enhancing connection strength of connection part which connects the electrode terminal 53 of the optical element 51 to the connection pad P1 of the wiring board 30, and formed so as to fill a gap between the upper surface of the optical waveguide 40 (the second cladding layer 43) and the lower surface of each optical element 51.

As illustrated in FIG. 6, each of optical elements 52 is mounted on the wiring board 30 on which the optical waveguide 40 is provided. More specifically, on the connection pad P2 of the wiring board 30, the solder 29 is formed. Then, the optical element 52 is electrically connected to the connection pad P2 of the wiring board 30 through the electrode terminal 53 and the solder 29. As a result, each of optical elements 52 is electrically connected to the wiring pattern 32B. Each of optical elements 52 is arranged so that the light receiving/emitting unit 54 thereof is facing the optical path conversion mirror 47B. Specifically, each of optical elements 52 is mounted on the wiring board 30 so that the light receiving/emitting unit 54 thereof is arranged just above the optical path conversion mirror 47B.

An underfill resin 62 is formed between each optical element 52 and the optical waveguide 40 provided on the wiring board 30. The underfill resin 62 is formed so as to fill the opening portion 40Y. The underfill resin 62 is a resin for enhancing connection strength of connection part which connects the electrode terminal 53 of the optical element 52 to the connection pad P2 of the wiring board 30, and formed so as to fill a gap between the upper surface of the optical waveguide 40 (the second cladding layer 43) and the lower surface of each optical element 52.

As the material of the underfill resins 61 and 62, it is possible to use the resin material which has the optical transparency in the wavelength region which is used by the respective optical elements 51 and 52. Specifically, as the material of the underfill resins 61 and 62, the same resin material as that of the first cladding layer 41, the core portion 42 and the second cladding layer 43 can be preferably used.

For example, in a case where the optical element 51 is the light emitting element, the light emitted from an optical axis center (light emitting point) of the light receiving/emitting unit 54 (here, the light emitting unit) is incident on the opening portion (the groove portion 44A) of the optical waveguide 40, as indicated by the arrows in FIG. 5. The light which is incident on the groove portion 44A is incident on the core portion 42A of the optical waveguide 40 after an optical path is bent by 90 degree by the optical path conversion mirror 47A formed on the inclined surface 45A of the groove portion 44A. Then, the light which is incident on the core portion 42A propagates by repeating total reflection in the core portion 42A. The light which propagates the core portion 42A penetrates the groove portion 44B. At this time, the light can propagate preferably inside of the groove portion 44B, since inside of the groove portion 44B is filled with the second cladding layer 43 which is formed by the substantially same material as the core portion 42A. On the other hand, for example, in a case where the optical element 52 is the light receiving element, as indicated by the arrows in FIG. 6, the light which propagates the inside of the core portion 42B of the optical waveguide 40 is emitted from the opening portion (the groove portion 44B) of the optical waveguide 40 after reflected by the optical path conversion mirror 47B, and incident on the optical axis center of the light receiving/emitting unit 54 (here, the light receiving unit) of the optical element 52.

Next, functions of the optical waveguide mounted wiring board 20 and the optical module 21 will be described.

In the optical waveguide 40 which is provided on the wiring board 30, two groove portions 44A and 44B are formed in each of five core portions 42, and the optical path conversion mirrors 47A and 47B are selectively formed on the inclined surface which has one groove portion of the two groove portions 44A and 44B which are formed in each core portion 42, and the optical path conversion mirrors 47A and 47B are formed in the zigzag shape in plan view. As a result, it is possible to arrange, in the zigzag shape in plan view, the three optical elements 51 which are optically coupled to the core portion 42A by the optical path conversion mirror 47A, and the two optical elements 52 which are optically coupled to the core portion 42B by the optical path conversion mirror 47B. For this reason, as compared to a case where one groove portion is formed in each of the core portions 42 so that the groove portions are arranged linearly along the Y direction and the optical elements are arranged above the grooves, respectively, it is possible to narrow the pitch P of the core portion 42 (refer to FIG. 1 or 4). More specifically, in a case where the optical elements are simply arranged linearly along the Y direction, it is difficult to form the pitch of the core portion narrower than 250 μm due to the size of the optical element. That is, in a case where the size of the optical element is about 500 μm×500 μm, if the pitch of the core portion is formed to be narrower than 250 μm, the optical elements adjacent to each other interfere with each other.

In contrast, in the optical module 21 according to the present embodiment, the optical elements 50 are arranged in the zigzag shape in plan view. For this reason, in a case where the size of the optical element 50 is about 500 μm×500 μm, it is possible to prevent the interference of adjacent optical elements 50 even though the pitch P of the core portion 42 is narrower than 250 μm. Thus, it is possible to narrow the pitch P of the core portion 42, and to form the core portion 42 (optical wiring) in high density.

Next, a method of manufacturing the optical waveguide mounted wiring board 20 will be described.

Figure 7A:
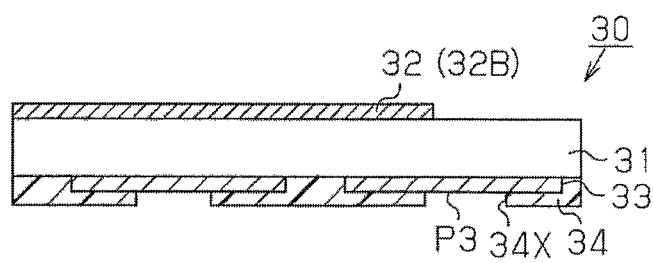
FIG. 7A is a schematic cross-sectional view showing a method of manufacturing the optical waveguide mounted wiring board according to the exemplary embodiment taken along line 7-7 in FIG. 7B.
Figure 7B:
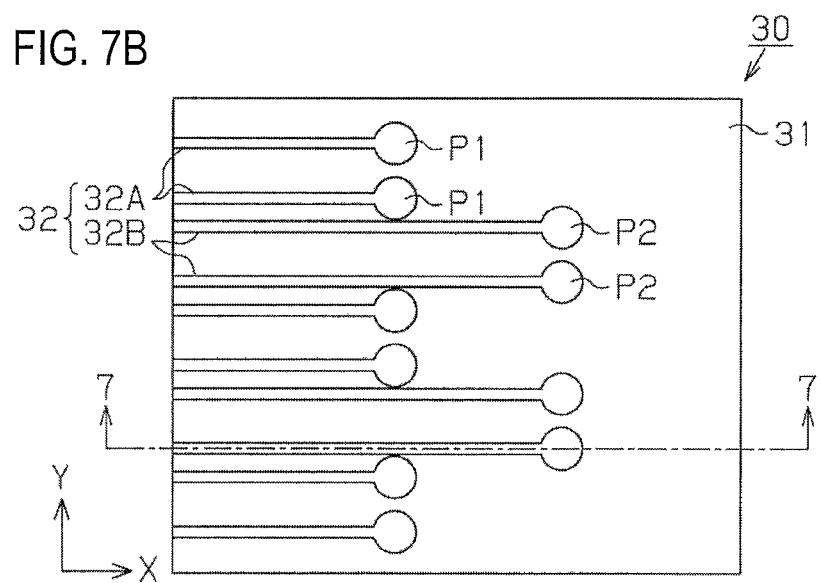
FIG. 7B is a schematic plane view showing the method of manufacturing the optical waveguide mounted wiring board according to the exemplary embodiment.
Figure 8A:
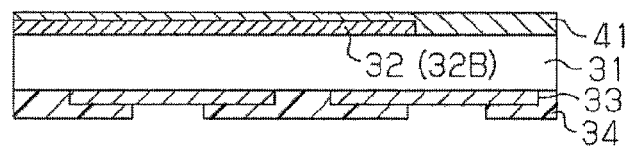
FIG. 8A is a schematic cross-sectional view showing the method of manufacturing the optical waveguide mounted wiring board according to the exemplary embodiment taken along line 8-8 in FIG. 8B.
Figure 8B:
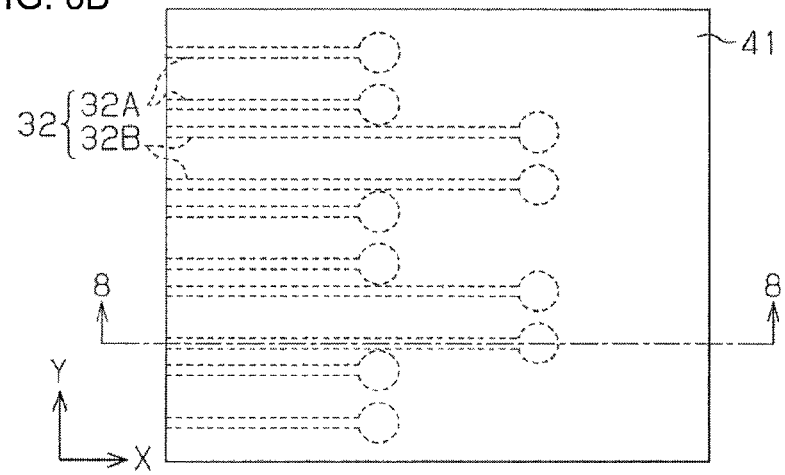
FIG. 8B is a schematic plane view showing the method of manufacturing the optical waveguide mounted wiring board according to the exemplary embodiment.

In the processes illustrated in FIGS. 7A and 7B, the wiring board 30 is first manufactured. For example, as illustrated in FIG. 7A, the wiring patterns 32 and 33 which are patterned in desired shapes are formed on both surfaces of the board main body 31. At this time, the wiring pattern 33 is patterned so that the external connection pad P3 is defined in a desired place. As illustrated in FIG. 7B, the wiring pattern 32, that is, the wiring pattern 32A and the wiring pattern 32B are patterned so that the connection pads P1 and P2 are defined in desired places. Subsequently, as illustrated in FIG. 7A, the solder resist layer 34 having the opening portion 34X which exposes a part of the wiring pattern 33 as the external connection pad P3 is formed on the lower surface of the board main body 31. For example, after the solder resist layer 34 is formed on the lower surface of the board main body 31 so that the wiring pattern 33 is covered for example, the solder resist layer 34 is exposed and developed using a photolithography method, thereby the opening portion 34X is formed in the solder resist layer 34. As a result, the wiring board 30 is manufactured. In addition, as necessary, the metal layer which is formed by sequentially providing, for example the Ni layer and the Au layer on the external connection pad P3 may be formed. The metal layer can be formed by an electroless plating method for example.

Next, according to FIGS. 8A to 11D, the optical waveguide 40 is provided (integrated) on the mounting surface side of the wiring board 30. First, in the processes illustrated in FIGS. 8A and 8B, the first cladding layer 41 is formed on the upper surface of the board main body 31 so as to cover the wiring patterns 32. For example, a photosensitive resin layer (not shown) which forms the first cladding layer 41 is formed on the entire upper surface of the board main body 31. The first cladding layer 41 is formed by curing the photosensitive resin layer. As a forming method of the photosensitive resin layer, a liquid photosensitive resin may be coated on the entire upper surface of the board main body 31, for example, or a photosensitive resin sheet in a semi-cured state may be provided on the entire upper surface of the board main body 31. Here, for example, an Ultraviolet (UV) curing resin can be preferably used as the photosensitive resin. For example, as the UV curing resin, a resin material which includes a modified acrylate (such as an epoxy resin or a polyester resin) as a base resin, a reactive acryl monomer necessary for a photo polymerization, a photo polymerization initiator, and an additive can be used. Main reaction of the UV-curing resin is a radical polymerization. It is possible to process at room temperature by using the UV-curing resin. Furthermore, it is possible to reduce working hours because it is cured in a short time even in a case where a heat-curing resin is used. The material of the photosensitive resin layer is used in the same manner in the process in which the core portion 42 and the second cladding layer 43 are formed, as described later.

Figure 9A:
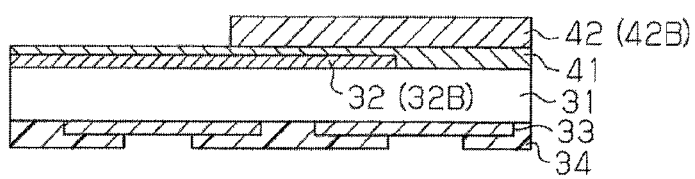
FIG. 9A is a schematic cross-sectional view showing the method of manufacturing the optical waveguide mounted wiring board according to the exemplary embodiment taken along line 9-9 in FIG. 9B.
Figure 9B:
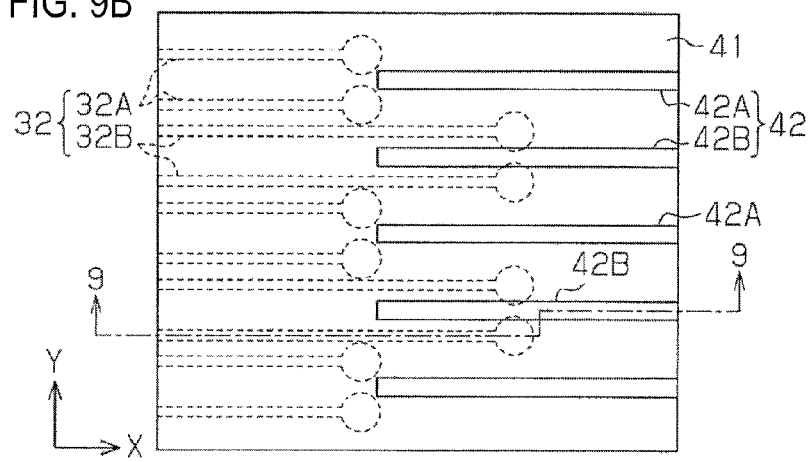
FIG. 9B is a schematic plane view showing the method of manufacturing the optical waveguide mounted wiring board according to the exemplary embodiment.

Next, in the process illustrated in FIGS. 9A and 9B, the core portions 42 are formed on the upper surface of the first cladding layer 41. For example, the photosensitive resin layer (not shown) which forms the core portions 42 are formed on the entire upper surface of the first cladding layer 41, and after an exposure and a development are performed based on the photolithography method, the photosensitive resin layer is cured. As a result, as illustrated in FIG. 9B, on the upper surface of the first cladding layer 41, the plurality of (here, 5 pieces) core portions 42 which are substantially formed in the band shape in plan view and extended linearly in the X direction are arranged side by side along the Y direction. Specifically, on the upper surface of the first cladding layer 41, the core portions 42A and 42B which are substantially formed in the band shape in plan view and extended linearly in the X direction are arranged alternatively along the Y direction. With respect to a predetermined position (the position of the core portion 42 to be formed) of the photosensitive resin layer, it is also possible to form the core portion 42 by selectively irradiating an active energy light beam or an electron beam, for example. At this time, in a region in which the active energy light beam or the electron beam is irradiated, the refractive index thereof varies, and a difference in the refractive index occurs between the region in which the active energy light beam or the electron beam is irradiated and the region in which the active energy light beam or the electron beam is not irradiated. The refractive index of the region in which the active energy light beam or the electron beam is irradiated can be increased or decreased depending on the material of the photosensitive resin layer, but the present embodiment selects the material in which the refractive index of the region where the active energy light beam or the electron beam is irradiated is increased.

Figure 10A:
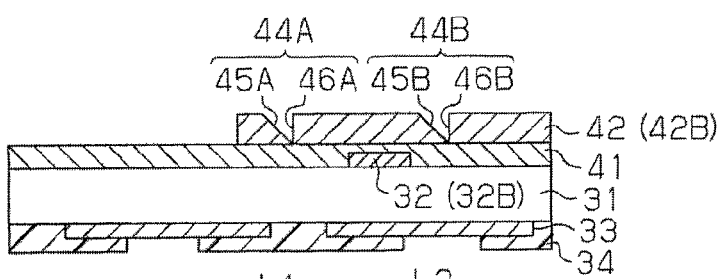
FIG. 10A is a schematic cross-sectional view showing the method of manufacturing the optical waveguide mounted wiring board according to the exemplary embodiment taken along line 10-10 in FIG. 10B.
Figure 10B:
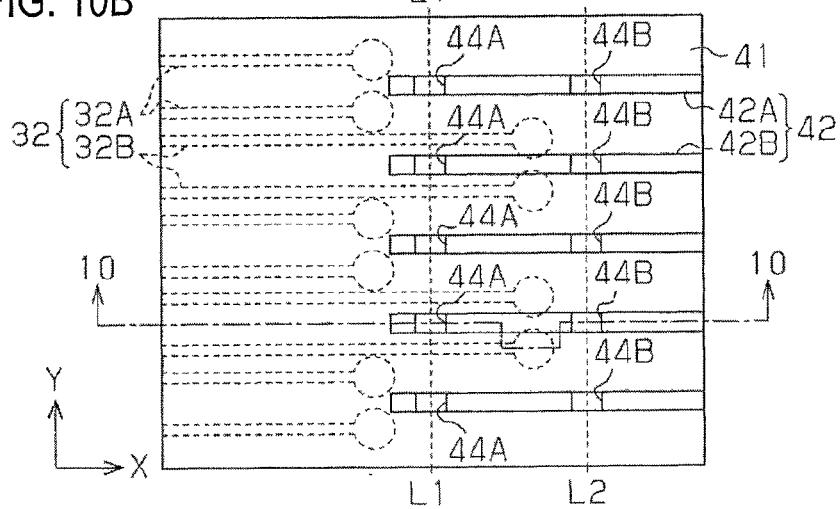
FIG. 10B is a schematic plane view showing the method of manufacturing the optical waveguide mounted wiring board according to the exemplary embodiment.

Next, in the process illustrated in FIGS. 10A and 10B, the two groove portions 44A and 44B which are separated from each other in an X direction are fixated in each of the core portions 42. More specifically, as illustrated in FIG. 10B, the core portions 42 in a cutting position L1 which includes the portions where the optical path conversion mirrors 47A are formed is first cut (machined) along the thickness direction, for example, the groove portions 44A with the substantial right triangle shapes in cross-sectional view is formed in the core portions 42 by a rotation blade or the like of a cutting apparatus. As a result, the groove portions 44A (refer to FIG. 10 A), each of which has the inclined surface 45A with an angle of 45 degree with respect to the upper surface of the core portion 42 and the sidewall surface 46A which intersects the inclined surface 45A, are arranged linearly along the Y direction in the core portions 42. That is, the groove portion 44A is formed in the same position (X coordinate position) of the X direction in each of the core portions 42A and 42B. Subsequently, by the rotation blade or the like of the cutting apparatus, the core portion 42 in the cutting position L2 which includes the region in which the optical path conversion mirror 47B is formed is cut (machined) in the thickness direction, and the groove portion 44B with the substantial right triangle shape in cross-sectional view is formed in the core portions 42. As a result, the groove portions 44B, each of which has the inclined surface 45B with an angle of 45 degree with respect to the upper surface of the core portion 42 and the sidewall surface 46B which intersects the inclined surface 45B, are arranged linearly along the Y direction in the core portions 42. That is, the groove portion 44B is formed in the same position of the X direction in each of the core portions 42A and 42B. As the forming method of the groove portions 44A and 44B, it is not limited to a cutting process, and various processing methods such as a laser ablation method can be used.

Figure 11A:
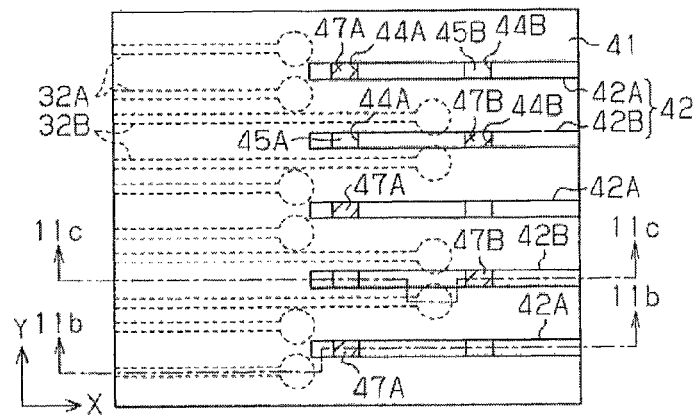
FIG. 11A is a schematic plane view showing the method of manufacturing the optical waveguide mounted wiring board according to the exemplary embodiment.
Figure 11B:
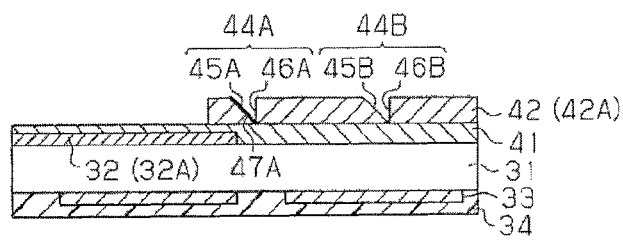
FIG. 11B is a schematic cross-sectional view showing the method of manufacturing the optical waveguide mounted wiring board according to the exemplary embodiment taken along line 11b-11b in FIG. 11A.
Figure 11C:
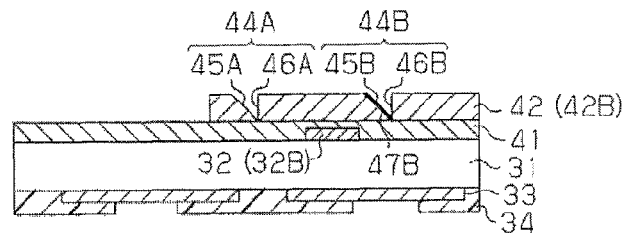
FIG. 11C is a schematic cross-sectional view showing the method of manufacturing the optical waveguide mounted wiring board according to the exemplary embodiment taken along line 11c-11c in FIG. 11A.

Subsequently, in the process illustrated in FIGS. 11A to 11C, the optical path conversion mirror 47A is formed only on the inclined surface 45A of the inclined surfaces 45A and 45B which are formed in the core portion 42A, and the optical path conversion mirror 47B is formed only on the inclined surface 45B of the inclined surfaces 45A and 45B which are formed in the core portion 42B. For example, by using a mask (not shown) having the opening portions only at places corresponding to the inclined surface 45A which is formed in the core portion 42A, and the inclined surface 45B which is formed in the core portion 42B, a glossy metal film is selectively deposited on the inclined surfaces 45A and 45B which are exposed from the opening portions. As a result, as illustrated in FIG. 11B, the optical path conversion mirror 47A is formed on the inclined surface 45A of the core portion 42A, and as illustrated in FIG. 11C, the optical path conversion mirror 47B is formed on the inclined surface 45B of the core portion 42B. As a method for depositing the metal film on the predetermined inclined surfaces 45A and 45B, there can be a sputtering method, a depositing method, a plating method or the like. As the material of the metal film, for example, gold, silver or aluminum which has a good light reflectivity can be used. After the optical path conversion mirrors 47A and 47B are formed, the above-described mask is removed.

Figure 11D:
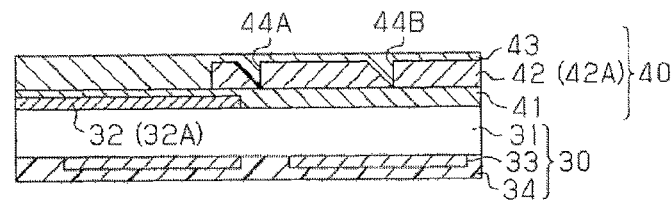
FIG. 11D is a schematic cross-sectional view showing the method of manufacturing the optical waveguide mounted wiring board according to the exemplary embodiment.

Next, in the process illustrated in FIG. 11D, on the upper surface of the first cladding layer 41, so as to fill the groove portions 44A and 44B which are formed in the core portion 42 and to cover the core portion 42, the second cladding layer 43 is formed. For example, the photosensitive resin layer (not shown) which forms the second cladding layer 43 is formed on the entire upper surface of the first cladding layer 41, and the second cladding layer 43 is formed by curing the photosensitive resin layer. By the above-described processes, the optical waveguide 40 in which the core portion 42 is surrounded by the first cladding layer 41 and the second cladding layer 43 is provided on the wiring board 30.

Figure 12A:
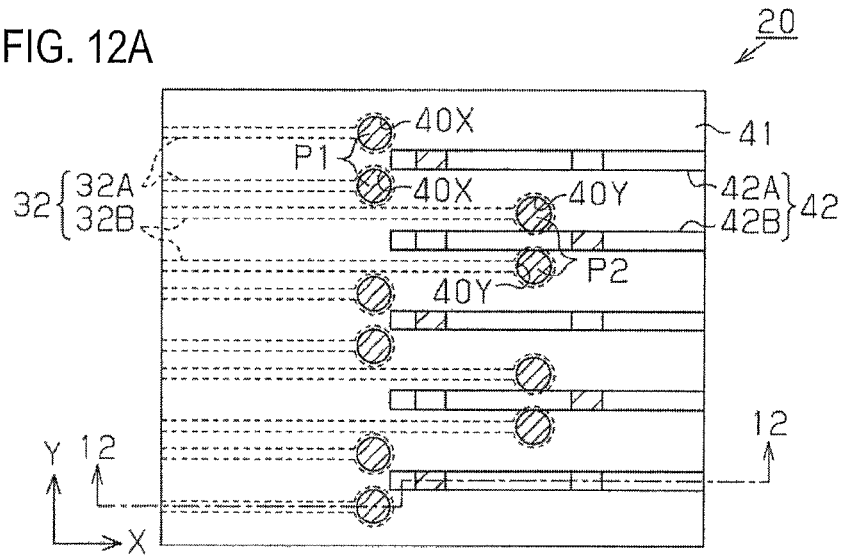
FIG. 12A is a schematic plane view showing the method of manufacturing the optical waveguide mounted wiring board according to the exemplary embodiment.
Figure 12B:
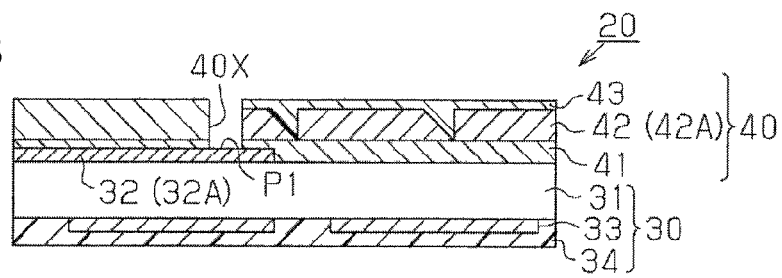
FIG. 12B is a schematic cross-sectional view showing the method of manufacturing the optical waveguide mounted wiring board according to the exemplary embodiment taken along line 12-12 in FIG. 12.

Subsequently, in the processes illustrated in FIGS. 12A and 12B, to expose a part of the wiring pattern 32A as the connection pad P1, the opening portion 40X is formed in a predetermined place of the optical waveguide 40. As illustrated in FIG. 12A, to expose a part of the wiring pattern 32B as the connection pad P2, the opening portion 40Y is formed in a predetermined place of the optical waveguide 40. Such opening portions 40X and 40Y can be formed by a laser processing method using a $CO_2$ laser, a UV-YAG laser or the like. In a case where the first cladding layer 41 and the second cladding layer 43 are formed by using the photosensitive resin, the opening portions 40X and 40Y may be formed by the photolithography method, for example. In FIG. 12A, the second cladding layer 43 is omitted for convenience.

By the above-described manufacturing process, the optical waveguide mounted wiring board 20 illustrated in FIGS. 1 to 3 can be manufactured.

Next, manufacturing method of the optical module 21 will be described.

Figure 13A:
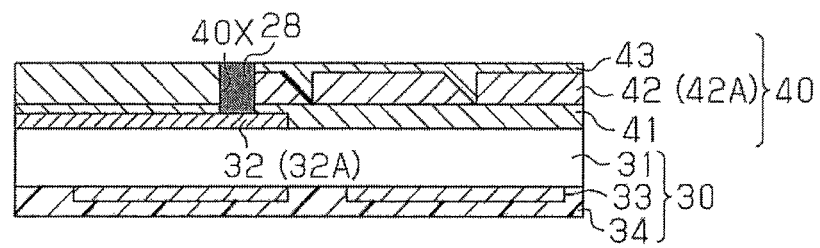
FIGS. 13A and 13B are schematic cross-sectional views showing a method of manufacturing an optical waveguide according to the exemplary embodiment.

In the process illustrated in FIG. 13A, the solder 28 is formed on the connection pad P1 which is exposed from the opening portion 40X of the optical waveguide 40. In the same manner, the solder 29 is formed (not shown) on the connection pad P2 which is exposed from the opening portion 40Y of the optical waveguide 40. Such solders 28 and 29 can be formed by solder paste coating, for example.

Figure 13B:
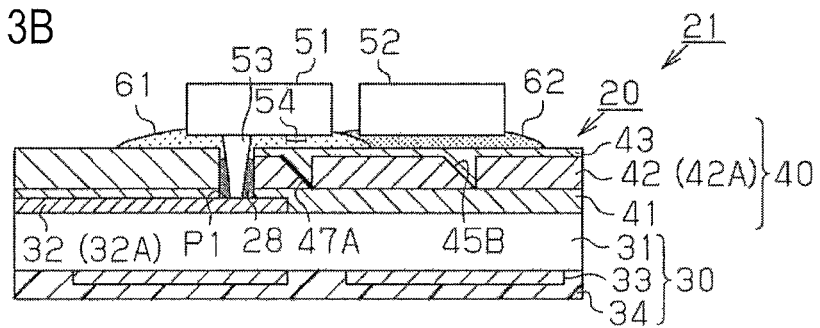

Next, in the process illustrated in FIG. 13B, in a state where the light receiving/emitting unit 54 of each optical element 51 is directed at the lower side, the electrode terminal 53 of each optical element 51 is positioned on the connection pad P1, and the electrode terminal 53 of each optical element 51 is electrically connected to the connection pad P1 by melting the solder 28. In the same manner, in a state where the light receiving/emitting unit 54 of each optical element 52 is directed at the lower side, the electrode terminal 53 of each optical element 52 is positioned on the connection pad P2, and the electrode terminal 53 of each optical element 52 is electrically connected to the connection pad P2 by melting the solder 29. As a result, the optical elements 51 and 52 are mounted on the wiring board 30 by flip chip bonding.

Subsequently, the underfill resin 61 is formed so as to fill the gap between the optical waveguide mounted wiring board 20 and the optical element 51, and the underfill resin 62 is formed so as to fill the gap between the optical waveguide mounted wiring board 20 and the optical element 52.

By the above-described manufacturing process, the optical module 21 illustrated in FIGS. 4 to 6 can be manufactured.

According to the present embodiments described above, it is possible to obtain the following effects.

(1) A plurality of the groove portions 44A and 44B are formed in each of the core portions 42, the optical path conversion mirrors 47A and 47B are selectively formed on the inclined surface having one of the groove portions 44A and 44B which are formed in the core portions 42, and the optical path conversion mirrors 47A and 47B are made to be formed in the zigzag shape in plan view. As a result, the optically coupled optical elements 51 and 52 can be arranged in the zigzag shape in plan view in the core portions 42A and 42B by the optical path conversion mirrors 47A and 47B, respectively. Thus, the pitch P of the core portion 42 can be narrowed, and the core portion 42 can be formed with high density. Furthermore, because the core portions 42 which are formed on the same flat surface can be formed with high density, it is possible to suppress the size of the thickness direction of the optical waveguide 40 from being increased.

(2) The groove portions 44A and 44B are formed in each of the core portions 42, the optical path conversion mirrors 47A and 47B are selectively formed on the inclined surface having arbitrary one of the groove portions 44A and 44B which are formed in the core portions 42, and such optical path conversion mirrors 47A and 47B are formed to be arranged in the zigzag shape in plan view. Thus, because the optical path conversion mirrors 47A and 47B can be collectively formed, the increment in the number of processes can be preferably suppressed.

(3) The core portion 42A optically coupled with the optical element 51 which is the light emitting element and the core portion 42B optically coupled with the optical element 52 which is the light receiving element are arranged alternatively along the Y direction. As a result, the core portion 42B optically coupled with the optical element 52 (the light receiving element) is arranged next to the core portion 42A optically coupled with the optical element 51 (the light emitting element). That is, the core portion 42B optically coupled with the optical element 52 (the light receiving element) is arranged between two core portions 42A optically coupled with the optical element 51 (the light emitting element). For this reason, even though the pitch P of the core portion 42 is narrow, a wide pitch of the core portion 42A can be secured. Therefore, even though the pitch P of the core portion 42 is narrow, an increment of the cross-talk between the channels of the optical element 51 is suppressed, and an increment of a cross-talk between the channels of the optical element 52 is suppressed. As a result, it is possible to accomplish the narrower pitch of the core portion 42, and it is possible to contribute to the minimization of the optical module 21.

Another Embodiment

Figure 14:
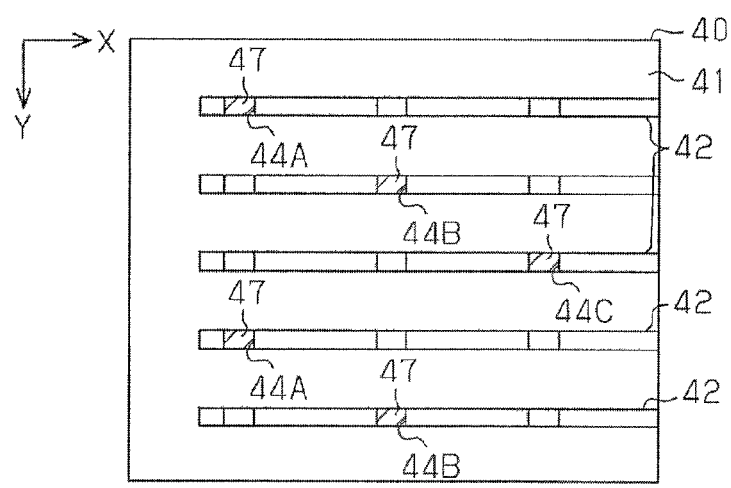
FIG. 14 is a schematic plane view showing an optical waveguide of a modified embodiment.
Figure 15:
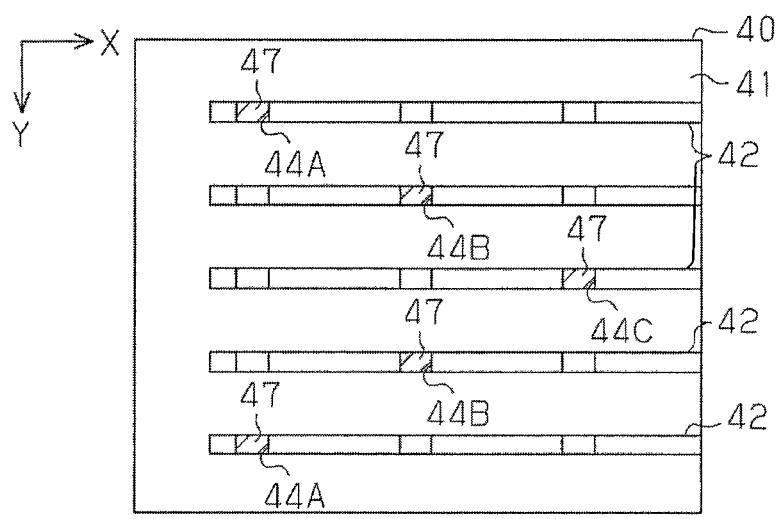
FIG. 15 is a schematic plane view showing an optical waveguide of a modified embodiment.

The present invention can be realized in the following embodiments. In the above-described embodiment, two groove portions 44A and 44B are formed in each of the core portions 42. Without being limited to this, three or more groove portions may be formed in each of the core portions 42, for example. Here, as illustrated in FIGS. 14 and 15, the case where three groove portions 44A, 44B and 44C are formed in each of the core portions 42 will be described. Even in this case, the optical path conversion mirrors 47, in the same manner as the above-described embodiment, are formed so that the optical path conversion mirrors 47 formed in the core portions 42 adjacent to each other are arranged at different positions to each other in the X direction. Specifically, in the examples of FIGS. 14 and 15, the optical path conversion mirrors 47 are formed so as to be arranged in the saw-tooth shape in plan view. Specifically, in the example of FIG. 14, the optical path conversion mirrors 47 are formed on the inclined surfaces of the groove portions 44A, 44B, 44C, 44A and 44B in the core portions 42 that are sequentially formed from the core portion 42 formed in the top of FIG. 14 towards the core portion 42 formed in the bottom of FIG. 14. In the example of FIG. 15, the optical path conversion mirrors 47 are formed on the inclined surfaces of the groove portions 44A, 44B, 44C, 44B and 44A in the core portions 42 that are sequentially formed from the core portion 42 formed in the top of FIG. 14 towards the core portion 42 formed in the bottom of FIG. 14.

Figure 16:
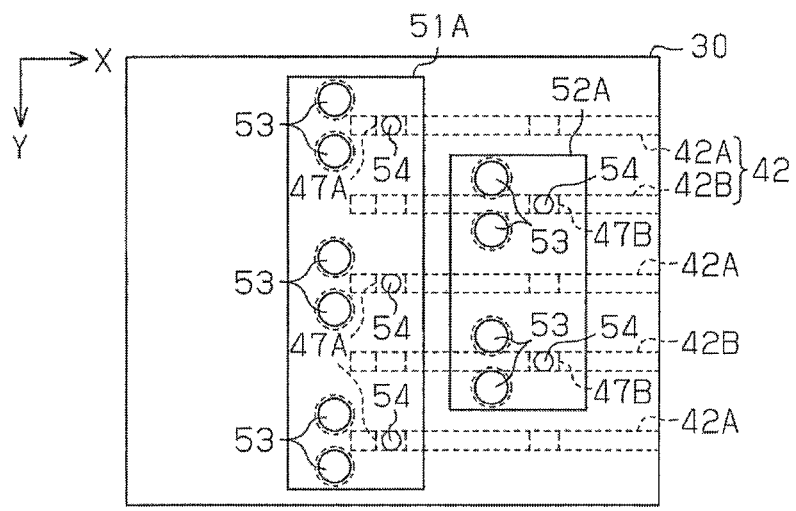
FIG. 16 is a schematic plane view showing an optical module of a modified embodiment.

In the above-described embodiments, with respect to the wiring board 30, the optical elements 51 and 52, each having single channel with one light receiving/emitting unit 54, are mounted. Without being limited to this, for example, as illustrated in FIG. 16, instead of the optical element 51 with three single channels, the optical element 51A which has three channels and the plurality of (here, 3 pieces) light receiving/emitting units 54 may be mounted on the wiring board 30. Instead of the optical elements 52 with two single channels, the optical element 52A which has two channels and the plurality of (here, 2 pieces) light receiving/emitting units 54 may be mounted on the wiring board 30.

In the above-described embodiments, the number (the number of core portions 42) of the channels of the optical module 21 is not particularly limited.

In the above-described embodiments, the groove portions 44A and 44B are filled by the second cladding layer 43. Without being limited to this, for example, the groove portions 44A and 44B are filled by a core layer which is formed with the same material as the core portion 42, and then the second cladding layer 43 may be formed on the first cladding layer 41 so as to cover the core portion 42 and the core layer.

The underfill resins 61 and 62 in the above-described embodiments may be omitted. The planar shape of the core portions 42A and 42B in the above-described embodiments is not limited to the linear shape, and may be a shape with a curved portion, a shape with a branch portion or an intersection portion, or a shape with a light collecting portion (for example, the portion where the width becomes narrower than that of other portion) or a light diffusion portion (for example, the portion where the width becomes wider than that of other portion), for example.

Various aspects of the subject-matter described herein are set out non-exhaustively in the following numbered clauses:

1. A method of manufacturing an optical waveguide, comprising:

forming at least two core portions extended in a first direction on a first cladding layer;

forming at least two groove portions on each of the N core portions at positions spaced apart from each other in the first direction, each groove portion having inclined surface;

forming an optical path conversion mirror on one of the inclined surfaces formed in each of the core portions; and forming a second cladding layer on the first cladding layer and the core portions, wherein the optical path conversion mirrors formed in the core portions adjacent to each other are arranged at positions different from each other in the first direction, and wherein the groove portions formed in the core portions adjacent to each other are arranged at the same positions in the first direction.

2. The method of manufacturing the optical waveguide according to clause 1, wherein each of the groove portions is formed by cutting the core portions in a thickness direction using a rotation blade of a cutting apparatus.

What is claimed is:

1. An optical waveguide comprising:
   a first cladding layer;
   at least two core portions formed on the first cladding layer and extended in a first direction;
   at least two groove portions formed in each of the core portions at positions spaced apart from each other in the first direction, each groove portion having an inclined surface;
   an optical path conversion mirror formed on one of the inclined surfaces formed in each of the core portions; and
   a second cladding layer formed on the first cladding layer and the core portions,
   wherein the optical path conversion mirrors formed in the core portions adjacent to each other are arranged at positions different from each other in the first direction, and
   wherein the groove portions formed in the core portions adjacent to each other are arranged at the same positions in the first direction.

2. The optical waveguide according to claim 1, wherein the second cladding layer fills the groove portions.

3. The optical waveguide according to claim 1, wherein the optical path conversion mirrors are arranged in a saw-tooth shape in plan view.

4. The optical waveguide according to claim 1, wherein all of the core portions have the same length in the first direction.

5. An optical module comprising:
   the optical waveguide according to claim 1;
   a wiring board arranged on an external surface side of the first cladding layer; and
   optical elements mounted on the wiring board and optically coupled with the core portions by the optical path conversion mirrors.

* * * * *